United States Patent [19]

Keep

[11] Patent Number: 4,874,809

[45] Date of Patent: Oct. 17, 1989

[54] REINFORCED POLYESTERS, ARTICLE THEREOF AND METHOD OF MAKING LOW WARPAGE ARTICLES

[75] Inventor: Gerald T. Keep, Kingsport, Tenn.

[73] Assignee: Eastman Kodak Company, Rochester, N.Y.

[21] Appl. No.: 148,242

[22] Filed: Jan. 25, 1988

[51] Int. Cl.$^4$ .............................................. C08L 67/02
[52] U.S. Cl. .................................. 524/449; 524/539; 525/444
[58] Field of Search ......................... 524/449; 525/444

[56] References Cited

U.S. PATENT DOCUMENTS

| | | | |
|---|---|---|---|
| 3,764,576 | 10/1973 | Russo | 260/40 R |
| 4,113,692 | 9/1978 | Wambach | 260/40 R |
| 4,115,333 | 9/1978 | Phipps, Jr. et al. | 260/22 R |
| 4,124,561 | 11/1978 | Phipps, Jr. et al. | 260/40 R |
| 4,125,571 | 11/1978 | Scott | 524/449 |
| 4,140,669 | 2/1979 | Phipps, Jr. et al. | 260/40 R |
| 4,140,670 | 2/1979 | Charles et al. | 260/40 R |
| 4,256,861 | 3/1981 | Davis et al. | 525/437 |
| 4,337,192 | 6/1982 | Campbell | 523/212 |
| 4,352,907 | 10/1982 | Lee | 524/537 |
| 4,393,153 | 7/1983 | Hepp | 523/201 |
| 4,436,860 | 3/1984 | Hepp | 524/394 |
| 4,460,731 | 7/1984 | Kochanowski et al. | 524/451 |
| 4,476,274 | 10/1984 | Liu | 524/445 |
| 4,536,531 | 8/1985 | Ogawa et al. | 524/135 |
| 4,539,390 | 9/1985 | Jackson, Jr. et al. | 528/303 |
| 4,613,634 | 9/1986 | McKie | 523/223 |

OTHER PUBLICATIONS

J. Grant, *Hack's Chemical Dictionary*, McGraw-Hill Book Co., NY, p. 533 (1972).

*Primary Examiner*—Patricia Short
*Attorney, Agent, or Firm*—John F. Stevens; William P. Heath, Jr.

[57] ABSTRACT

A glass fiber and mica-reinforced polyester composition useful in the production of shaped articles of low warpage is provided by blending (a) about 55% to about 99%, based on total polyester weight, of poly(ethylene terephthalate), (b) about 1% to about 45%, based on total polyester weight, of poly(cyclohexane-dimethylene terephthalate), (c) about 5% to about 50%, based on the total weight of the composition, of glass fibers, and (d) about 5% to about 50%, based on the total weight of the composition, of mica the total glass fiber and mica weight being less than 75% based on the total weight of the composition.

1 Claim, No Drawings

000
REINFORCED POLYESTERS, ARTICLE THEREOF AND METHOD OF MAKING LOW WARPAGE ARTICLES

FIELD OF THE INVENTION

This invention relates to reinforced polyester compositions, articles made therefrom and a method of making shaped articles having low warpage with the reinforced polyester compositions. These compositions are useful, e.g., in the formulation of low warpage thermoplastic molding compositions.

BACKGROUND OF THE INVENTION

Warpage of injection-molded parts is a common problem in glass fiber-reinforced poly(ethylene terephthalate) (PET). Warpage is a complex phenomenon and is affected by mold design, processing parameters and post-processing handling during the cooling process. This invention addresses mainly the aspects of warpage that are affected by the resin formulation and reduces warpage by the use of blends containing PET and poly(cyclohexanedimethylene terephthalate) (PCT). Warpage is often tested for on a relative basis by molding thin rectangular plaques, in which warpage effects are pronounced. Warpage is defined for the case of plaques as the ratio of the perpendicular deviation from a plane of the corners (see formula in Example 1) to the length of the diagonal of the specimen (ASTM D1181).

Special low warpage grades of glass fiber and mica-reinforced poly(ethylene terephthalate) have been developed in the past by adding to the polymer mineral fillers such as mica, in conjunction with the glass fibers. Reduction in warpage by the use of such mineral fillers is usually explained on a mechanical basis, citing a different rheological orientation of the mica plates, as compared to the glass fibers, in the molding process, and the subsequent reinforcement by these fillers. See especially U.S. Pat. No. 4,476,274. Another factor which is often cited as contributing to lower warpage is volume contraction during crystallization of the matrix. It has now been found that a particular blend of polyesters, reinforced with glass fiber and mico results in compositions having less tendency to warp. U.S. Pat. Nos. of interest are as follows: 4,613,634, 4,536,531, 4,476,274, 4,460,731, 4,436,860, 4,393,153, 4,337,192, 4,140,670, 4,140,669, 4,124,561, 4,115,333, 4,113,692 and 3,764,576.

SUMMARY OF THE INVENTION

The invention relates to glass fiber and mica-reinforced polyester compositions useful in the production of a shaped article of low warpage, the compositions comprising (a) about 55% to about 99%, based on total polyester weight, of poly(ethylene terephthalate), (b) about 1% to about 45%, based on total polyester weight, of poly(cyclohexanedimethylene terephthalate), (c) about 5% to about 50%, based on the total weight of the composition, of glass fibers, and (d) about 5% to about 50%, based on the total weight of the composition, of mica the total glass fiber and mica weight being less than 75% based on the total weight of the composition.

This invention also relates to shaped articles of manufacture of low warpage which are made from the polyester blend of this invention.

In another aspect, the invention relates to a method of producing a shaped polyester article of low warpage, the method comprising blending (a) about 55% to about 99%, based on total polyester weight, of poly(ethylene terephthalate), (b) about 1% to about 45%, based on total polyester weight, of poly(cyclohexanedimethylene terephthalate), (c) about 5% to about 50%, based on the total weight of the composition, of glass fibers, and (d) about 5% to about 50%, based on the total weight of the composition, of mica the total glass fiber and mica weight being less than 75% based on the total weight of the composition and forming an article of a desired shape.

Other objects, advantages and features of the present invention will become apparent to those skilled in the art from the following detailed description of the invention.

DESCRIPTION OF THE PREFERRED EMBODIMENTS

The present invention provides compositions which are simple to prepare and which afford a reduction in warpage when the blend is used for the manufacture of a shaped article.

It has surprisingly been found that replacing a minor portion of the poly(ethylene terephthalate) in glass fiber and mica-reinforced PET composition with poly(cyclohexanedimethylene terephthalate) provides a formulation upon molding which results in, inter alia, reduced-warpage thermoplastic molded articles. This low warpage effect depends somewhat on the type of mica used and the use to which the blend is put. With muscovite mica, up to more than a 4-fold reduction in warpage is seen with substitution of PCT for some of the PET in the chosen test configuration. This effect is not as pronounced in formulations based on phlogophite micas. In applications where mold release is not as critical, formulations based on phlogophite micas will also benefit from substitution of PCT for some of the PET in the formulation.

As already indicated, the mechanical basis for the low warpage effect of mineral fillers used by the prior art has been explained by a different rheological orientation of the mineral in the polyester matrix and the volume contraction obtained during the crystallization of such matrix. However, neither of these factors explain how the blend of the twto crystallizable polymers, PET and PCT, in the presence of glass fibers and mica, have significantly lower warpage than the individual polyesters, nor why different micas react differently to this substitution.

A possible explanation is that the trapped water given off from the mica (there is known to be more moisture in muscovites than phlogophites), as well as the functional groups on the mica surface, effect a chemical reaction of the polyesters at this interface. Since PCT is less sensitive to moisture than PET, unusual chemical, mechanical, or rheological effects may be set up at the mica interface. Property changes might be thus related to the resultant adhesion and/or ductility of the micaresin interface.

The PET portion of the composition of this invention is preferably derived from a diacid component comprising about 90 to 100 mole percent of terephthalic acid (or ester thereof, e.g., dimethyl terephthalate) and about 90 to 100 mole percent of ethylene glycol. The remainder can be any monomer that results in a copolymer that does not substantially change the properties of the PET. The PET polyester suitably has an inherent viscosity of about 0.3 to 1.0, preferably about 0.5 to 0.7 dl/g.

The inherent viscosities (I.V.) of the polyesters herein are determined according to ASTM D2857-70 procedure in a Wagner Viscometer of Lab Glass Inc. of Vineland, New Jersey having a 178 ml capillary bulb, using a polymer concentration of 0.5% by weight in 60/40 by weight phenol/tetrachloroethane solvent. The procedure comprises heating the polymer/solvent system at 120° C. for 15 minutes to enhance dissolution of the polymer, cooling the solution to 25° C. and measuring the time of flow at 25° C. The I.V. is calculated from the equation $$\eta = \frac{\ln(t_s/t_o)}{C}$$

where
$\eta$ = inherent viscosity at 25° C. at a polymer concentration of 0.5 g/100 ml of solvent;
ln = Natural logarithm;
$t_s$ = Sample flow time;
$t_o$ = Solvent-blank flow time; and
C = Concentration of polymer in grams per 100 ml of solvent = 0.50.

The PCT portion of the compositions of this invention is preferably derived from a diacid component comprising about 90 to 100 mole percent of terephthalic acid and about 90 to 100 mole percent of 1,4-cyclohexanedimethanol. The remainder can be any monomer that results in a copolymer that does not substantially change the properties of the PCT. The PCT polyester suitably has an inherent viscosity of about 0.3 to 1.2, preferably about 0.6 to 0.9 centipoise as measured in a 60/40 mixture of phenol and tetrachloroethane. However, PET and PCT polyesters with inherent viscosities other than those stated above can also be used in the invention.

Both the PET and the PCT polyesters of the invention are prepared by processes well known in the art. Examples of these processes can be found in U.S. Pat. Nos. 4,256,861 and 4,539,390, and include preparation of direct condensation or by ester interchange. Preferably, the polyesters are prepared by ester interchange which, in brief, involves first reacting the dicarboxylic acid with an alcohol to form a diester, such as dimethyl terephthalate. The diester is then ester-interchanged with a diol to form a bis ester, such as bis 2-hydroxyethyl terephthalate, which is condensed at low pressure and high temperature to form the polyester. The condensation reaction is allowed to continue until a desired inherent viscosity (I.V.) is obtained.

The glass fibers and mica are each present in the composition of the invention in a reinforcing amount, which normally ranges from about 5% to 50% by weight of the total composition for each, the total glass fiber and mica content being less than 75% of the compositions. Preferably, the amount of each is in the range of about 10% to 30% by weight of the total composition. The glass fibers may be introduced into the composition as chopped glass fibers or continuous glass fiber rovings. Such fibers normally have a diameter of about 5-50 microns. Introduction of the glass fibers and mica can be effected at any time during the blending operation, and preferably they and the polyesters are blended together at the same time. They may also be added during the preparation of the polymers. This is done only in those cases where the polymerization reaction is not adversely affected. Mica is a flake material and is commercially available. Diameter may vary between about 50 microns and about 1000 microns. Preference is given to use of muscovite micas over the use of phlogophite micas.

The polyester blend of the invention may include further additives such as colorants, crystallization aids, plasticizers, impact modifiers, mold releases, and flame retardants, and inert fillers such as talc, calcium carbonate, silica, and the like. These additives are added in amounts known in the art to effect desired improvements in properties.

The pllyester blend of the composition may be prepared by methods known in the art. Typically, the PET and the PCT are compounded in the presence of glass fibers and mica, employing a suitable mixing or blending means as, e.g., a tumble blender or a Henschel mixer, and compounding the mix in an extruder. The blended product as is, or preferably chopper into pellets, may then be shaped by molding, extrusion, and compression molding, among other operations. Such operations are standard in the art and need not be further described herein.

Such polyester blends are of value in any application where a low degree of warpage is required. Examples of such applications are thin-walled boxes or trays, automotive grilles, chair arms, circuit board substrates, and in general, any part which must match the dimensions of another part in assembly.

Articles prepared from blends of the invention are found to possess up to more than a 4-fold reduction in warpage, with respect to the pure PET reinforced blends when measured as described hereafter. It is recognized that warpage is a very complex phenomenon and will depend on the application at hand.

Having now generally described this invention, the same will be better understood by reference to certain specific examples, which are included herein for purposes of illustration only and are not intended to be limiting of the invention or any embodiment thereof, unless so specified.

EXAMPLES

The warpage tests reported in the following examples were conducted utilizing a modification of the ASTM method D1181. In the examples, the ingredients are described as follows:
PET is poly(ethylene terephthalate) having an inherent viscosity of 0.62.
PCT is poly(cyclohexanedimethylene terephthalate) having an inherent viscosity of 0.77.
Glass fibers are Owens Corning 492AA 1/8 in. glass fibers.
Phlogophite mica is Suzorite 60HK grade mica.

The compositions are compounded on a single-screw extruder, and injection molded into an edge-gated mold for 3"×3"×1/16" plaques held at 150° C. The runners were left on and the plaque laid on a table top during cooling.

The samples are conditioned at room temperature at least 24 hours prior to the warpage being measured. The diagonal and thickness of the plaques are measured with an error of about ±0.001 in. The plaque is held in a horizontal plane and the vertical displacement from the level of the center is measured for each of the four corners of the plaque. Finally, the warpage of each plaque is calculated based on the following equation $$W = \frac{abs(NC/NNC) + abs(PC/NPC)}{D}$$

wherein

W = warpage, either concave or saddle, in thousandths of inches per inch
NC = sum of the negative corner heights, in thousandths of inches
NNC = number of negative corners,
PC = sum of the positive corner heights, in thousandths of inches
NPC = number of positive corners,
D = length of the diagonal of the specimen (in inches), and
abs() = absolute value (no distinction between negative and positive numbers)

All measurements are made with a Starrett Dial Comparator and a micrometer. An average value is found by repeating the measurement on a large number of specimens. Warpage units are multiplied by $10^{-3}$ to get a value in in./in. (For example, 2.7 warpage units is $2.7 \times 10^{-3}$ in./in.)

EXAMPLE 1 Two compositions are prepared as follows

| | |
|---|---|
| (I) | 25.4% glass fibers |
| | 12.4% phlogophite mica |
| | 62.2% polyester-based on total polyester weight, 68 is PET and 32% is PCT |
| (II) | 25.4% glass fibers |
| | 12.4% phlogophite mica |
| | 62.2% PET |

The warpage of the plaques molded from compositions (I) and (II) are compared hereafter. The molded parts containing PCT exhibit a warpage of only 2.7 warpage units when compared to 3.2 warpage units for the non-PCT containing parts. Other mechanical properties were not changed substantially.

This same batch of pellets, when aged for several months, gave warpages of 5.0 units vs. 5.3 units upon molding (under theoretically identical process conditions). The apparent sensitivity to aging, small variations in processing conditions, relative humidity or other ambient conditions not withstanding, the benefit from addition of PCT remains. However, this also illustrates that comparison of warpage results for evaluation of the resins must only be between data sets obtained in parallel (i.e., taken from moldings made in immediate succession on the same day).

Other work with formulations based on Suzorite 60HK mica showed similar effects of smaller magnitude. At the same time, however, mold release was sometimes a significant problem and could overshadow the effect of substituting some PCT for PET in some cases. Thus, while a formulation with 20% glass and 15% mica improved warpage (5.6 vs. 6.9) upon substitution of PCT for 30.8% of the PET, a formulation with 30% glass and 10% mica had slightly higher warpage (6.5 vs. 6.3) upon substitution of PCT for 33.3% of the PET, while a formulation with 40% glass and 5% mica had worse warpage (7.3 vs. 6.6) upon substitution of PCT for 36.4% of the PET due to mold release problems.

In a different series with 30% glass and 10% mica, substitution of PCT for 1.7, 8.3, 16.7 and 25.0% of the PET brought warpages of 9.8, 9.4, 8.4, and 6.7 warpage units respectively. While these numbers reflect a high absolute warpage due in part to mold release problems, the change in warpage with increased substitution of PCT for PET is marked.

The subsequent examples show that the formulations with muscovite mica have a more pronounced reaction to PCT substitution than formulations comprising phlogophite micas. However, the data show that the effect of PCT substitution is present even in the later formulations and could be useful in applications in which mold release is not as significant (e.g. in larger, stronger parts than were used in the present case for testing).

EXAMPLE 2

| | |
|---|---|
| (I) | 30% glass fibers |
| | 10% muscovite mica |
| | 60% polyester-based on total polyester weight, 66% is PET and 34% is PCT |
| (II) | 30% glass fibers |
| | 10% muscovite mica |
| | 60% PET |

Two compositions are prepared as in Example 1 and contain the following components.

The molded parts made from a blend containing PCT exhibit a warpage of only 2.1 warpage units as compared to 9.5 warpage units for the non-PCT containing molded parts. Other mechanical properties were not changed substantially.

EXAMPLE 3

The components are as in Example 2. Two compositions are prepared as in Example 1 which contain

| | |
|---|---|
| (I) | 20% glass fibers |
| | 15% muscovite mica |
| | 65% polyester-based on total polyester weight, about 70% is PET and about 30% is PCT |
| (II) | 20% glass fibers |
| | 15% muscovite mica |
| | 65% PET |

The parts made from a blend containing PCT exhibit a warpage of only 2.1 warpage units as compard to 6.9 warpage units for the non-PCT containing parts. Other mechanical properties were not changed substantially.

EXAMPLE 4

The components are as in Example 2. Two compositions are prepared as in Example 1 and contain the following components.

| | |
|---|---|
| (I) | 40% glass fibers |
| | 5% muscovite mica, |
| | 55% polyester-based on total polyester weight, about 64% is PET and about 36% is PCT |
| (II) | 40% glass fibers |
| | 5% muscovite mica |
| | 55% PET |

The parts made of the blend containing PCT exhibited a warpage of only 5.8 warpage units as compared to 7.0 warpage units for the non-PCT containing parts. Other mechanical properties were not changed substantially.

Unless otherwise specified, all parts, percentages, ratios, etc. are by weight.

The invention now being fully described, it will be apparent to one of ordinary skill in the art that many changes and modifications can be made thereto without departing from the spirit or scope of the invention as set forth herein.

What is claimed is:

1. A reinforced polyester composition useful in the production of a molded article of low warpage, said composition comprising
    (a) about 55% to about 99%, based on total polyester weight, of poly(ethylene terephthalate),
    (b) about 1% to about 45%, based on total polyester weight, of the homopolymer poly(cyclohexanedimethylene terephthalate),
    (c) about 5% to about 50%, based on the total weight of the composition, of glass fibers, and
    (d) about 5% to about 50%, based on the total weight of the composition, of mica the total glass fiber and mica weight being less than 75% based on the total weight of the composition.

* * * * *